United States Patent [19]

Yamada

[11] Patent Number: 4,618,874
[45] Date of Patent: Oct. 21, 1986

[54] SOLID STATE IMAGING DEVICE
[75] Inventor: Tetsuo Yamada, Yokohama, Japan
[73] Assignee: Kabushiki Kaisha Toshiba, Tokyo, Japan
[21] Appl. No.: 647,899
[22] Filed: Sep. 6, 1984
[30] Foreign Application Priority Data
  Sep. 7, 1983 [JP] Japan ............................. 58-164855
[51] Int. Cl.⁴ ..................... H01L 27/14; H01L 31/00
[52] U.S. Cl. .......................................... 357/30; 357/24
[58] Field of Search ............... 357/24 LR, 30, 32, 52, 357/16; 358/213, 212, 209

[56] References Cited
U.S. PATENT DOCUMENTS
4,011,105  3/1977  Paivinen et al. .................... 357/52
4,389,661  6/1983  Yamada ......................... 357/24 LR
4,498,013  2/1985  Kuroda et al. .................. 357/24 LR OTHER PUBLICATIONS
Hynecek, "Virtual Phase Technology: A New Approach to Fabrication of Large-Area CCD's," IEEE Transactions on Electron Devices, vol. ED-28, No. 5, May 1981.
Teranishi et al., "No Image Lag Photodiode Structure in the Interline CCD Image Sensor", IEDM 82, pp. 324–327.

Primary Examiner—James W. Davie
Assistant Examiner—Georgia Y. Epps
Attorney, Agent, or Firm—Finnegan, Henderson, Farabow, Garrett & Dunner

[57] ABSTRACT

There is disclosed a solid state imaging device comprising P+ regions formed in photo-electro converting element regions and the separating region defined therebetween, respectively, the P+ regions being continuous to each other and defining no step portion therebetween. There is also disclosed a method of manufacturing the imaging device, the method comprising a step of forming P+ regions in photo-electro converting element regions and the separating region defined therebetween, respectively.

2 Claims, 13 Drawing Figures

F I G. 2D
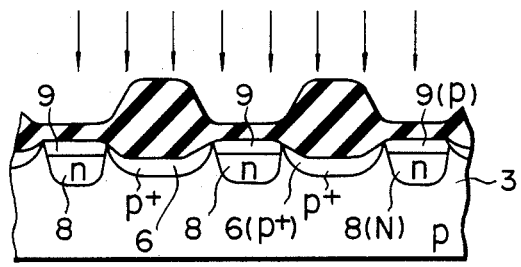
F I G. 3
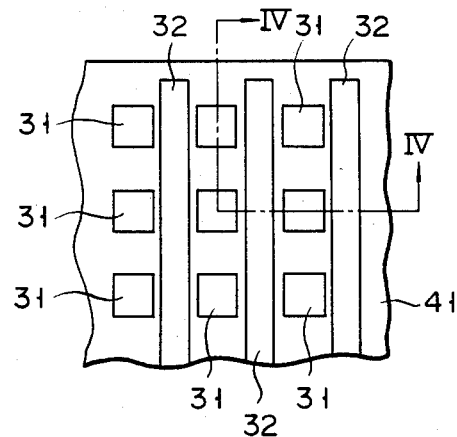
F I G. 4A
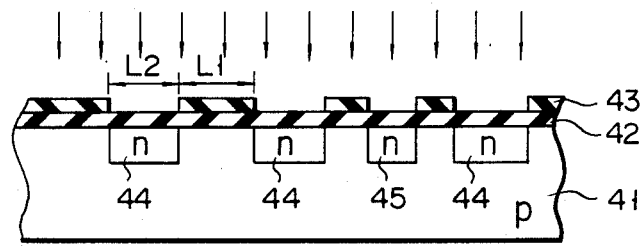

F I G. 5A
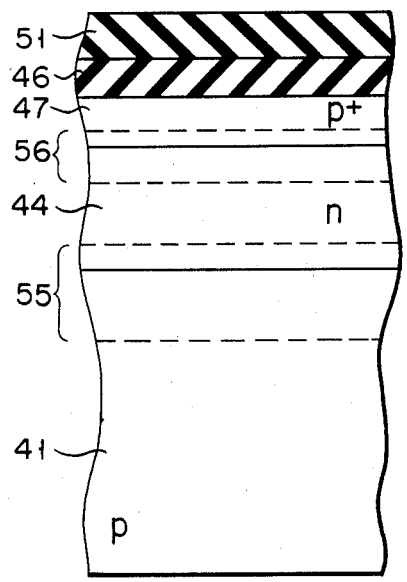
F I G. 5B
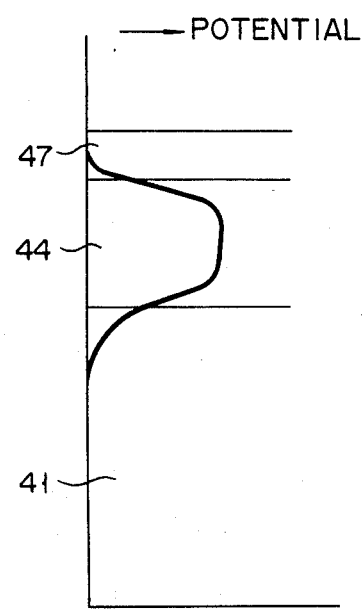
F I G. 6
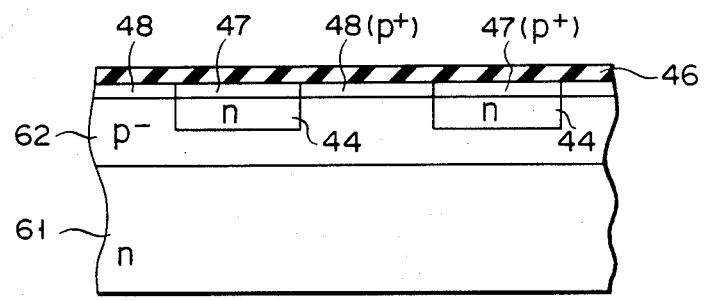

SOLID STATE IMAGING DEVICE

BACKGROUND OF THE INVENTION

This invention relates to a solid state imaging device and a manufacturing method thereof.

A known solid state imaging device has a pattern, as shown in FIG. 1, of photo-electro converting elements or element regions 1 and charge transfer elements or element regions 2.

On manufacturing, an insulation film 4 is formed on a semiconductor substrate 3 of the P conductivity type, as shown in FIG. 2A. A silicon nitride (SiN) film 5 of a predetermined pattern is formed on the insulation film 4. An impurity ion of the P conductivity type is implanted into the substrate 3, using the SiN film 5 as a mask, thereby forming p+ impurity regions 6. Thereafter, the structure is subjected to a local oxidation process in an oxide atmosphere of more than 1,000° C., thereby expanding those regions 7 of the insulation film 4 not covered by the SiN film 5, as shown in FIG. 2B. The regions 7 are for the elements 1 and 2. Then, the SiN film 5 is removed, and an impurity ion of the N conductivity type is implanted into the substrate 3, using the insulation film 4 as a mask, thereby forming N impurity regions 8, as shown in FIG. 2C. The impurity regions 8 form photo-electro converting elements 1. The structure is then subjected to a thermal diffusion process so that the impurity regions 8 have the predetermined thickness in the substrate 3. An impurity ion of the P conductivity type is implanted into the substrate 3, thereby forming P impurity regions 9. The impurity regions 9 prevent a depletion layer at the surface of the substrate 3 from occurring, which, in turn, prevents a leak or dark current from flowing through the substrate surface.

However, with the conventional manufacturing method as described above, the separating regions 7 of the film 4 expand in the lateral and vertical directions of the substrate 3 at the local oxidation step. The lateral expansion of the separating regions 7 decreases the areas of the photo-electro converting element regions and charge transfer element regions. This lowers the conversion efficiency of the converting elements and the transfer efficiency of the transfer elements. In order to avoid the reduction of the converting regions and transfer regions, it is required that the size L1 of those regions of the SiN film 5 which correspond to the separating regions 7 be reduced. However, the size L1 of the regions of the SiN film 5 are required to have a value equal to or larger than a value which is critically defined from the aspect of the lithography technique. That is, from this aspect, the size L1 can not be considerably reduced. Therefore, in the actual manufacturing process, the size L2 of those regions of the SiN film 5 which correspond to the converting regions is largely set. However, this decreases the packing density of the elements, which, in turn, increases the chip size of the imaging device.

Also in the conventional manufacturing process, the impurity regions 6 and 9 are formed at separate steps to define step portions therebetween. These step portions are inconvenient for the high packing density of the elements of the imaging device.

SUMMARY OF THE INVENTION

This invention has been achieved under the above described circumstances and has for its object to provide a solid state imaging device of a high packing density in which less leak current flows.

Another object of the invention is to provide a method of manufacturing the solid state imaging device as mentioned above.

According to the invention, there is provided a solid state imaging device comprising: a semiconductor layer having a first conductivity type; a plurality of photo-electro converting element regions having a second conductivity type formed in the semicondutor layer, the converting regions being arranged in a predetermined pattern; a plurality of charge transfer element regions having said second conductivity type formed in said semiconductor layer, the charge transfer elements for transferring charges generated in said converting elements; and further regions having said first conductivity type formed in said photo-converting regions and in the separating region defined therebetween, respectively, the further regions having an impurity concentration higher than that of said semiconductor layer, and the further regions being continuous to each other and defining no step portion therebetween.

According to the invention, there is further provided a method of manufacturing a solid state imaging device comprising: a step of forming a plurality of photo-electro converting element regions in a semiconductor layer, the semiconductor layer having a first conductivity type and the converting regions having a second conductivity type; a step of forming a plurality of charge transfer element regions in said semiconductor layer, the semiconductor regions having said second conductivity type; and a step of forming further regions in said photo-electro converting regions and in the separating region defined therebetween, the further regions having said first conductivity type and having an impurity concentration higher than that of said semiconductor layer.

BRIEF DESCRIPTION OF THE DRAWINGS

FIGS. 2A to 2D show enlarged sectional views of the structures of the conventional, prior art imaging device as shown in FIG. 1, taken along the line II—II thereof, at respective manufacturing steps;

FIG. 3 shows a pattern of photo-electro converting elements and transfer elements of a solid state imaging device according to an embodiment of the invention;

FIGS. 4A to 4D show enlarged sectional views of the structures of the imaging device shown in FIG. 3, taken along the line IV—IV thereof, at respective manufacturing steps;

FIG. 5A shows an enlarged cross sectional view of the structure shown in FIG. 4D, taken along the line V—V thereof;

FIG. 5B shows the potential profile of the structure of FIG. 5A; and

FIG. 6 shows a partial sectional view of a solid state imaging device according to another embodiment of the invention.

DETAILED DESCRIPTION OF THE PREFERRED EMBODIMENT

Figure 1:
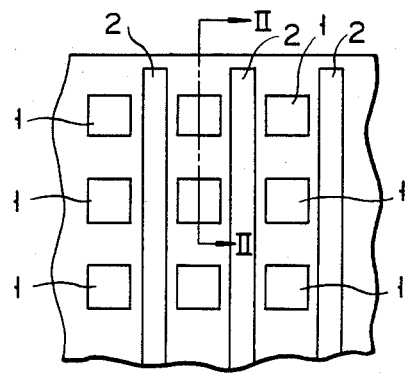
FIG. 1 shows a pattern of photo-electro converting elements and transfer elements of a conventional, prior art solid state imaging device.
Figure 2A:
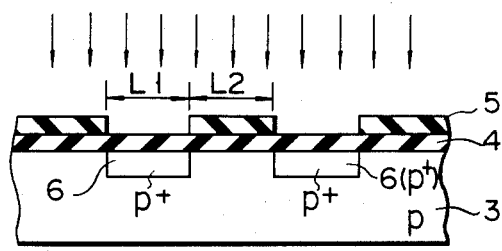
Figure 2B:
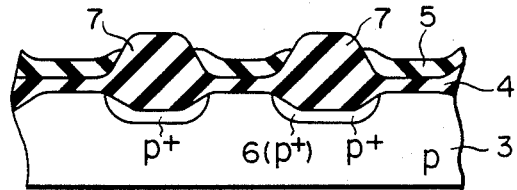
Figure 2C:
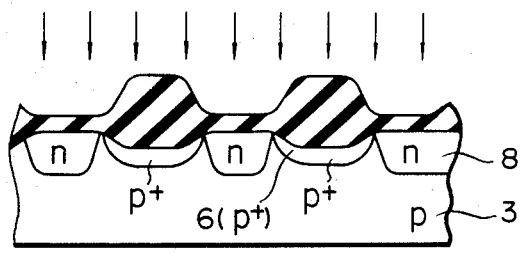

In FIG. 3, a plurality of photo-electro converting elements or element regions 31 are formed in the substrate 41 of the P conductivity type. The converting elements 31 are arranged in a two-dimensional or matrix form in a plan view. The converting elements 31 generate electric charges therein when an incident light is received. A plurality of charge transfer elements or element regions 32 are also formed in the substrate 41. The charge transfer elements 32 extend along the columns, extending vertically in FIG. 3, of the converting elements 31 and extend between two adjacent columns of the converting elements 31. In the pattern shown in FIG. 3, each of the transfer elements 32 reads out the charge from the converting elements 31 of the column at the left side of each transfer element 32. The transfer elements 32 are made of a charge coupled device (CCD), for example.

There will now be described a method of manufacturing the imaging device shown in FIG. 3 with reference to FIGS. 4A to 4D.

As shown in FIG. 4A, an oxidation or insulation film 42 is formed on a semiconductor substrate 41 of the P conductivity type. A photoresist film 43 of a predetermined pattern is formed on the insulation film 42. An N type impurity ion, for example, phosphorus, is implanted into the substrate 41 through an ion-implantation step, using the photoresist film 43 as a mask, thereby forming a plurality of N conductivity regions 44 and 45. N regions 44 form the photo-electro converting elements 31. The N region 45 forms the charge transfer element 32. The structure is then subjected to a thermal diffusion process to activate the implanted impurity thereby expanding the N regions 44 and 45 to have a predetermined depth in the substrate 41.

Figure 4B:
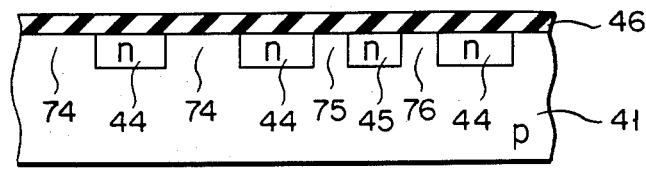

Thereafter, as shown in FIG. 4B, the films 42 and 43 are removed and a gate oxidation film 46 is formed on the substrate 41. The film 42 may not be removed. In this case, the film 42 may be used as the gate insulation film 46.

Figure 4C:
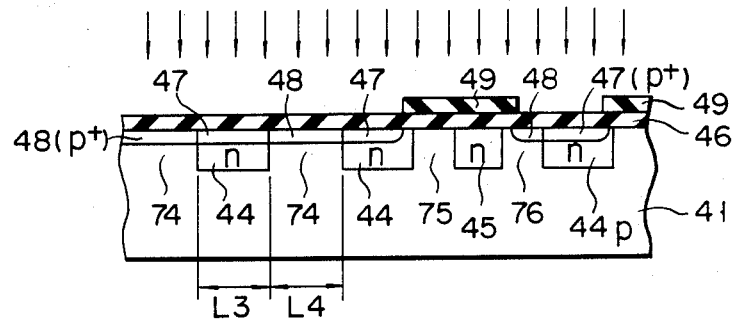

Thereafter, as shown in FIG. 4C, a photoresist film 49 of a predetermined pattern is formed on the oxidation film 46. A P type impurity ion, boron, for example, is implanted in the substrate 41 through an ion-implantation step, using as a mask the photoresist film 49, thereby forming a P+conductivity region 47 in the surface regions of the N regions 44 and also a P+conductivity region 48 in the surface region of that region 74 in the substrate 41, which is between the regions 44 and separates the regions 44 from each other. The region 48 extends to that region 76 in the substrate 41, which is between the transfer element region 45 and the converting element region 44 (the one at the right side of the transfer element region 45). The region 76 separates the regions 45 and 44 just mentioned from each other. The region 48 does not extend to that region 75 of the substrate 41, which is between the transfer element region 45 and the converting element region 44 (the one at left side of the transfer element region 45), from which the transfer element 45 reads out the charges. The region 75 separates the regions 45 and 44 just mentioned from each other. P+regions 47 and 48 are of an impurity concentration higher than that of the substrate 41 and are continuous to each other. Then, the photoresist film 49 is removed.

Figure 4D:
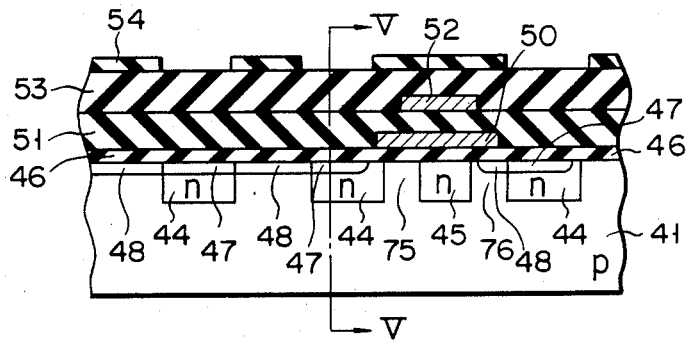

Thereafter, as shown in FIG. 4D, a first electrode layer 50 of polysilicon is formed on that region of the oxidation film 46 which corresponds to the transfer element region 45 and separating region 75. An insulation film 51 of SiO₂, for example, is formed on the surface of the structure at a low temperature, not in excess of 1,000° C., treatment. A second electrode layer 52 of polysilicon is formed on that region of the insulation film 51 which corresponds to the first electrode layer 50. A protecting insulation film 53 of SiO₂, for example, is formed on the surface of the structure. A light shielding film 54 is formed on that region of the second insulation layer 53 which corresponds to the region other than the photo-electro converting element regions 44.

As described above, the imaging device as shown in FIG. 3 is manufactured. According to the manufacturing method as described above, P+regions 47 and 48 are formed by the same step. Therefore, size L4 (FIG. 4C) of the region 74 is set at a value which is critically defined from the aspect of the lithography technique.

Also according to the manufacturing method described above, size L3 (FIG. 4C) of N region 44 is a little larger than size L2 (FIG. 4A), because the N regions 44 laterally extend during the thermal diffusion process. This enhances the converting efficiency of the converting regions 44.

Also according to the manufacturing method described above, P+regions 47 and 48 are formed after the step of forming the gate insulation film 46. Therefore, less lateral diffusions of the N regions 47 and 48 will occur, and the amount of ion to be implanted will be suppressed. This enhances the accuracy of the size of the elements and also enhances uniformity of the impurity concentration.

The oxidation film 46, which is somewhat damaged, may be removed after the step of forming P+regions 47 and 48, and a fresh oxidation film may be provided instead.

Also according to the manufacturing method as described above, P+regions 47 and 48 are continuous to each other and define no step portion therebetween. This gives no step portion to the oxidation film 46. This decreases the requirements on manufacturing for a high packing density, which, in turn, decreases the size L4 of the separating region 74 (FIG. 4C) to a critical value which is defined from the aspect of the lithography technique.

Also according to the method described above, the P+region 48 is not formed on the separating region 75. This reduces the required control voltage for charge transfer.

With the manufacturing method described above, N regions 44 and 45 are formed by the same step. However, N regions 44 and 45 may be formed at separate steps.

With the device of FIG. 4D, as shown in FIG. 5A, a depletion layer 55 occurs at the PN junction between the substrate 41 and the N region 44 and another depletion layer 56 also occurs at the PN junction between the P+region 47 and the N region 44. The potential profile of the structure of FIG. 5A is as shown in FIG. 5B. The P+region 47 prevents a depletion layer at the surface of the substrate 41 from occurring. Therefore, a leak or dark current flowing through the surface of the substrate 41 is minimally suppressed.

In another embodiment as shown in FIG. 6, a semiconductor layer 62 of the P−conductivity type is formed on a semiconductor substrate 61 of the N conductivity type. On the P−layer 62, the same construction as that in the earlier described embodiment is formed, using the same manufacturing steps as those described with reference to FIGS. 4A to 4D. In the device of FIG. 6, the N substrate 61 acts as a drain for absorbing the excessive charges generated when the converting element regions 44 receive a strong incident light. It is necessary for enhancing the drain function of the substrate 61 to reduce the impurity concentration or thickness of the P−layer 62. When the impurity concentration is reduced, the junction capacitance defined between the N region 44 and the P−layer 62 is reduced. Nevertheless, the N region 44 has a total large storage capacitance, because the N region 44 has a sufficiently large junction capacitance between itself and the P+ region 47. It is obvious that the effects obtained by the first described embodiment are also obtained by this embodiment as shown in FIG. 6. In FIG. 6, the same numerals are used as those used in FIGS. 4A to 4D for the same or corresponding parts in FIGS. 4A to 4D and FIG. 6. In the above embodiments, the impurity concentration and thickness of the P+ regions 47 and 48 are about $1 \times 10^{17}/cm^2$ to about $10 \times 10^{17}/cm^2$ and about 0.1 $\mu m$ to about 0.4 $\mu m$. In the described embodiments, the N and P conductivity types may obviously be replaced by each other.

What is claimed is:

1. A semiconductor device in a solid state imaging device comprising:

a semiconductor layer of a first conductivity type;

one or more photo-electro converting elements, of a second conductivity type, formed in said semiconductor layer, said converting elements being arranged in a predetermined pattern;

one or more charge transfer elements, of said second conductivity type, formed in said semiconductor layer, said charge transfer elements transferring charges generated in said converting elements; and one or more further elements of said first conductivity type for suppressing the flow of dark current through the surface of said semiconductor layer, said further elements being formed in said photo-electro converting elements and in the separating region defined therebetween, said further elements having an impurity concentration higher than that of said semiconductor layer.

2. A semiconductor device according to claim 1, wherein the solid stage imaging device further comprises a semiconductor substrate having a second conductivity type, and said semiconductor layer is formed on said semiconductor substrate.

* * * * *

UNITED STATES PATENT AND TRADEMARK OFFICE
CERTIFICATE OF CORRECTION

PATENT NO. : 4,618,874

DATED : October 21, 1986

INVENTOR(S) : TETSUO YAMADA

It is certified that error appears in the above-identified patent and that said Letters Patent is hereby corrected as shown below:

On the title page, please delete "Tokyo" and insert

--Kawasaki-- as the assignee's correct address.

Signed and Sealed this

Fourteenth Day of April, 1987

Attest:

DONALD J. QUIGG

Attesting Officer

Commissioner of Patents and Trademarks